(12) United States Patent
Murakami et al.

(10) Patent No.: US 10,243,035 B2
(45) Date of Patent: Mar. 26, 2019

(54) METHOD OF MANUFACTURING SWITCHING ELEMENT

(71) Applicant: TOYOTA JIDOSHA KABUSHIKI KAISHA, Toyota-shi, Aichi (JP)

(72) Inventors: Yuki Murakami, Toyota (JP); Yasushi Urakami, Kariya (JP); Yusuke Yamashita, Nagakute (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 15/805,727

(22) Filed: Nov. 7, 2017

(65) Prior Publication Data

US 2018/0175140 A1    Jun. 21, 2018

(30) Foreign Application Priority Data

Dec. 19, 2016  (JP) ................................. 2016-245762

(51) Int. Cl.
| | |
|---|---|
| H01L 29/00 | (2006.01) |
| H01L 29/06 | (2006.01) |
| H01L 29/16 | (2006.01) |
| H01L 29/10 | (2006.01) |
| H01L 29/66 | (2006.01) |
| H01L 29/78 | (2006.01) |
| H01L 21/04 | (2006.01) |
| H01L 29/423 | (2006.01) |

(52) U.S. Cl.
CPC ...... *H01L 29/0607* (2013.01); *H01L 21/0475* (2013.01); *H01L 29/1095* (2013.01); *H01L 29/1608* (2013.01); *H01L 29/4236* (2013.01); *H01L 29/66068* (2013.01); *H01L 29/7813* (2013.01)

(58) Field of Classification Search
CPC ............ H01L 29/0607; H01L 21/0475; H01L 29/1095; H01L 29/1608; H01L 29/4236; H01L 29/66068; H01L 29/7813
See application file for complete search history.

(56) References Cited

U.S. PATENT DOCUMENTS

| | | | |
|---|---|---|---|
| 2010/0224932 A1 | 9/2010 | Takaya et al. | |
| 2014/0169045 A1* | 6/2014 | Ueno | ................... H01L 29/7393 363/37 |
| 2018/0240906 A1* | 8/2018 | Tsujimura | ........... H01L 29/7813 |

FOREIGN PATENT DOCUMENTS

JP        2007-242852 A      9/2007

* cited by examiner

*Primary Examiner* — Mounir S Amer
*Assistant Examiner* — Alexander Belousov
(74) *Attorney, Agent, or Firm* — Oliff PLC

(57) ABSTRACT

A method of manufacturing a switching element is provided. The method including: preparing a semiconductor substrate which includes an n-type drain region, a p-type body region, and a trench penetrating the body region and reaching the drain region; and forming a lateral surface p-type region extending along a lateral surface of the trench below the body region by heating the semiconductor substrate so as to make a part of the body region flow into the trench. The switching element includes: a gate insulating layer covering an inner surface of the trench; a bottom p-type region in contact with the gate insulating layer at a bottom surface of the trench and connected to the lateral surface p-type region; an n-type source region; and a gate electrode provided in the trench.

4 Claims, 12 Drawing Sheets

METHOD OF MANUFACTURING SWITCHING ELEMENT

TECHNICAL FIELD

A technique disclosed herein relates to a method of manufacturing a switching element.

BACKGROUND

Japanese Patent Application Publication No. 2007-242852 describes a switching element having a trench structure. This switching element includes a bottom p-type region in contact with a gate insulating layer at a bottom surface of a trench, and a lateral surface p-type region extending along a lateral surface of the trench and connecting a body region and the bottom p-type region. In a state where the switching element is off, a depletion layer spreads from the bottom p-type region to an n-type region around the bottom p-type region. This suppresses an electric field applied to the gate insulating layer in a vicinity of a lower end of a gate electrode. Therefore, this switching element has a high withstand voltage. Moreover when the switching element is turned on, holes flow from the body region to the bottom p-type region via the lateral surface p-type region, and thereby a potential of the bottom p-type region is maintained approximately equal to a potential of the body region. Accordingly, a potential difference between the bottom p-type region and the n-type region around the bottom p-type region becomes small, and the depletion layer that spreads in the n-type region contracts toward the bottom p-type region in a short time. Therefore, this switching element has a low on-resistance immediately after being turned on.

SUMMARY

In the technique in Japanese Patent Application Publication No. 2007-242852, the lateral surface p-type region is formed by implanting p-type impurities into the lateral surface of the trench. However, when the p-type impurities are implanted into the lateral surface of the trench, a crystal defect is formed in a semiconductor region in a vicinity of the lateral surface of the trench, such as in the lateral surface p-type region and the like. The formed crystal defect can be eliminated at a certain rate by thermally treating a semiconductor substrate. However, a crystal defect density in the semiconductor region in the vicinity of the lateral surface of the trench is still high as compared to before the implantation of p-type impurities. When the crystal defect density in the semiconductor region in the vicinity of the lateral surface of the trench is increased, a leakage current occurs via that region having the high crystal defect density. Therefore, a technique of manufacturing a switching element in which a leakage current is less likely to flow and which comprises a lateral surface p-type region is provided herein.

A method of manufacturing a switching element, which is disclosed herein, may comprise preparing a semiconductor substrate, and forming a lateral surface p-type region. In the preparation of the semiconductor substrate, the semiconductor substrate that includes an n-type drain region, a p-type body region, and a trench is prepared. The body region is provided on the the drain region and located at a surface of the semiconductor substrate, and the trench extends from the surface so as to penetrate the body region and reach the drain region. In the formation of the lateral surface p-type region, the lateral surface p-type region extending along a lateral surface of the trench below the body region is formed by heating the semiconductor substrate so as to make a part of the body region flow into the trench. The switching element to be manufactured may comprise a gate insulating layer, a bottom p-type region, a source region, and a gate electrode. The gate insulating layer covers an inner surface of the trench. The bottom p-type region is provided in the semiconductor substrate, in contact with the gate insulating layer at a bottom surface of the trench, and connected to the lateral surface p-type region. The source region is an n-type region provided in the semiconductor substrate, in contact with the gate insulating layer at the lateral surface of the trench, and separated from the drain region by the body region. The gate electrode is provided in the trench, insulated from the semiconductor substrate by the gate insulating layer, and faces the source region, the body region, and the drain region via the gate insulating layer.

It should be noted that the gate insulating layer, the bottom p-type region, the source region, and the gate electrode may be formed at any timing.

In this manufacturing method, the lateral surface p-type region is formed by heating the semiconductor substrate so as to make a part of the body region flow into the trench. A semiconductor region obtained by a semiconductor material being melted and then solidified has an extremely low crystal defect density. Therefore, in this manufacturing method, a semiconductor region (semiconductor region including the lateral surface p-type region) in the vicinity of the lateral surface of the trench has an extremely low crystal defect density. Accordingly a leakage current that flows via the semiconductor region in the vicinity of the lateral surface of the trench can be suppressed. In other words, according to this manufacturing method, a switching element through which a leakage current is less likely to flow and which comprises a lateral surface p-type region can be manufactured.

DETAILED DESCRIPTION

Figure 1:
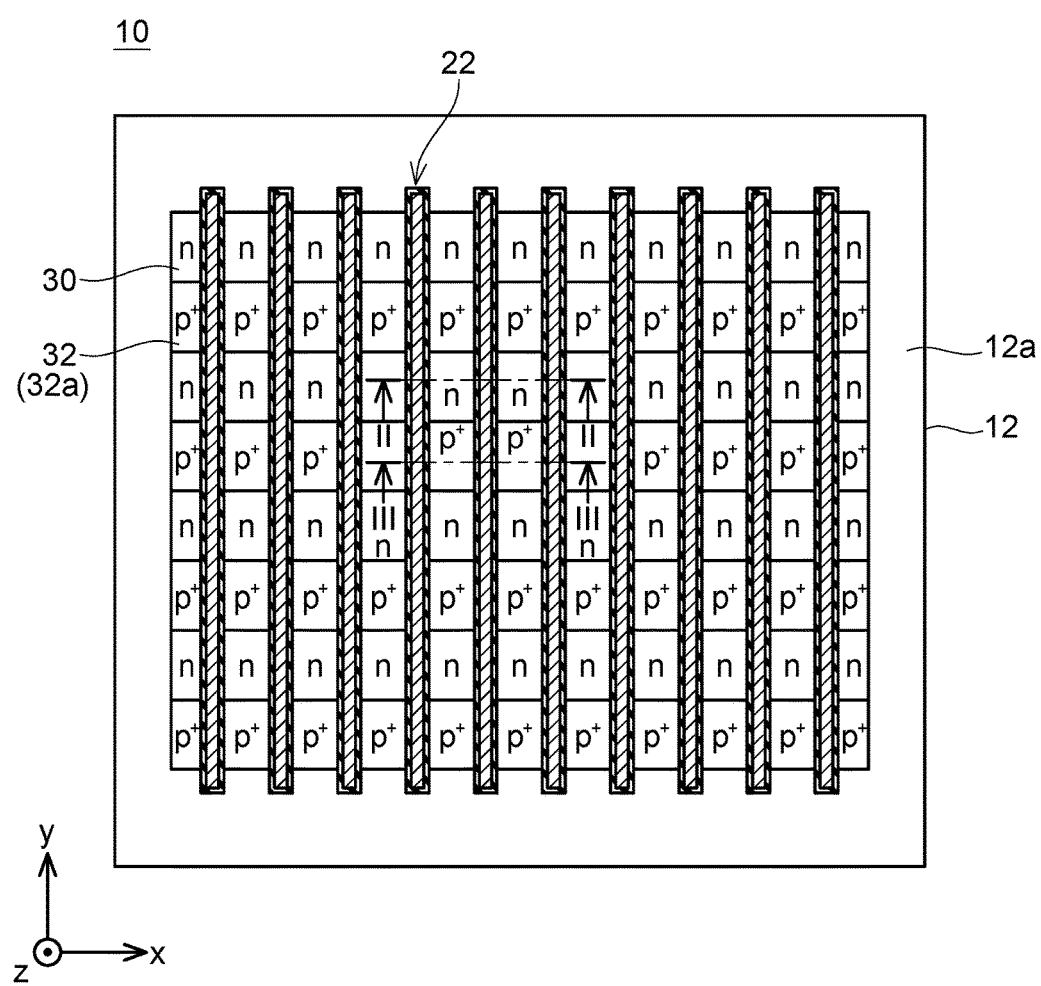
FIG. 1. is a plan view of a switching element 10.
Figure 2:
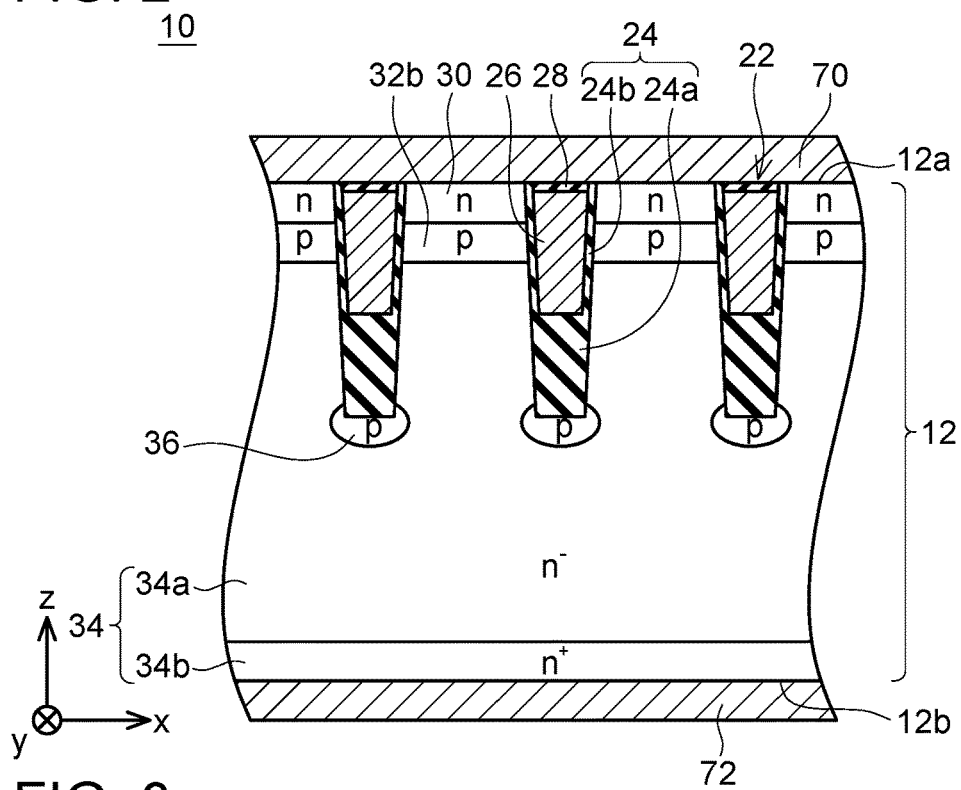
FIG. 2 is a cross-sectional view taken along a line II-II in FIG. 1.
Figure 3:
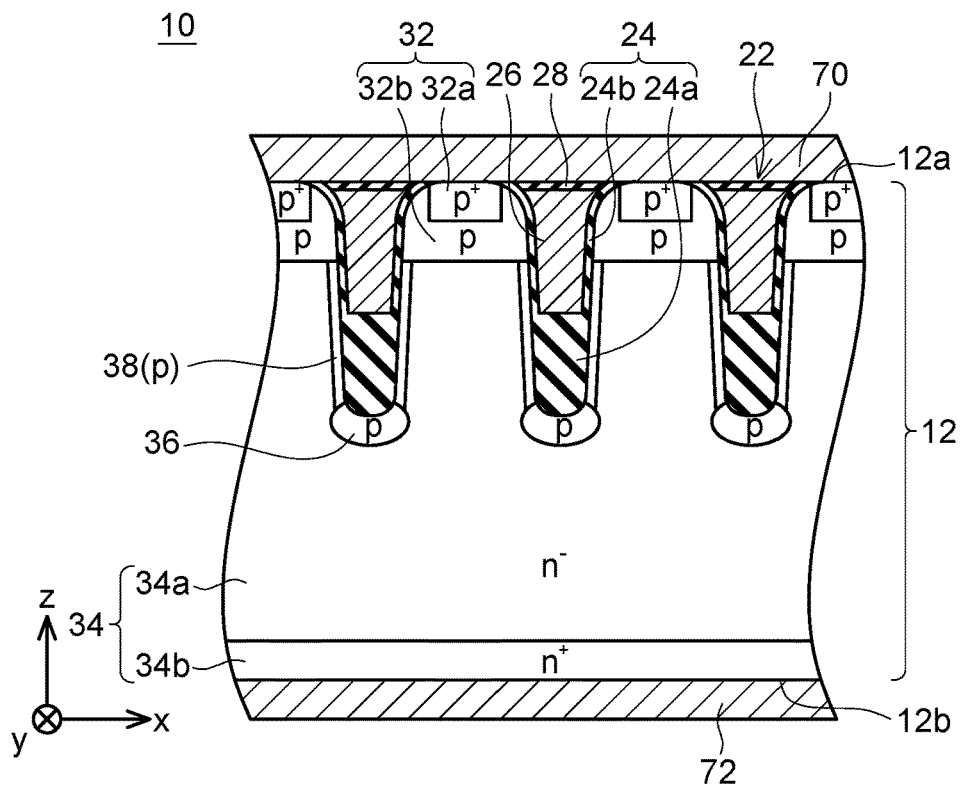
FIG. 3 is a cross-sectional view taken along a line III-III in FIG. 1.

A switching element 10 of an embodiment shown in FIGS. 1 to 3 is a MOSFET (Metal-Oxide-Semiconductor Field-Effect Transistor). The switching element 10 comprises a semiconductor substrate 12, an electrode, an insulating layer, and the like. It should be noted, in FIG. 1, an electrode and an insulating layer on an upper surface 12a of the semiconductor substrate 12 are not shown for ease of viewing the drawing. Hereinbelow, a direction parallel to the upper surface 12a of the semiconductor substrate 12 is referred to as an x-direction, a direction parallel to the upper surface 12a and orthogonal to the x-direction is referred to as a y-direction, and a thickness direction of the semiconductor substrate 12 is referred to as a z-direction. The semiconductor substrate 12 is a SiC (silicon carbide) substrate, a main material of which is SiC.

In the upper surface 12a of the semiconductor substrate 12, a plurality of trenches 22 is provided. As shown in FIG. 1, each of the trenches 22 extends linearly long in the upper surface 12a in the y-direction. The trenches 22 are arranged to be spaced apart from one another in the x-direction. Moreover, as shown in FIG. 1, in a range located at the upper surface 12a of the semiconductor substrate 12, a plurality of n-type source regions 30 and a p-type body region 32 are provided. In the upper surface 12a, the source regions 30 and the body region 32 extend long in the x-direction so as to intersect the trenches 22. The source regions 30 and the body region 32 are provided so as to be alternately arranged in the y-direction in the upper surface 12a. FIG. 2 shows a cross section of a range where the source region 30 is provided at the upper surface 12a, and FIG. 3 shows a cross section of a range where the body region 32 is provided at the upper surface 12a.

The cross section shown in FIG. 2 differs from the cross section shown in FIG. 3 in a shape of the trenches 22. In the cross section shown in FIG. 3, a lateral surface and a bottom surface of each trench 22 are connected by a curved surface smoother than that in the cross section shown in FIG. 2. Moreover, in the cross section shown in FIG. 3, the lateral surface of each trench 22 and the upper surface 12a of the semiconductor substrate 12 are connected by a curved surface smoother than that in the cross section shown in FIG. 2.

As shown in FIGS. 2 and 3, an inner surface of each trench 22 is covered with a gate insulating layer 24. The gate insulating layer 24 comprises a bottom insulating layer 24a and a lateral surface insulating layer 24b. The bottom insulating layer 24a is provided at a bottom of the trench 22. The bottom insulating layer 24a covers the bottom surface of the trench 22, and the lateral surface of the trench 22 in a vicinity of that bottom surface. The lateral surface insulating layer 24b covers the lateral surface of the trench 22 above the bottom insulating layer 24a. The bottom insulating layer 24a has a thickness larger than a thickness of the lateral surface insulating layer 24b. In each trench 22, a gate electrode 26 is provided. Each gate electrode 26 is insulated from the semiconductor substrate 12 by its corresponding gate insulating layer 24. An upper surface of each gate electrode 26 is covered with an interlayer insulating film 28.

As shown in FIGS. 2 and 3, on the upper surface 12a of the semiconductor substrate 12, an upper electrode 70 is provided. The upper electrode 70 is in contact with the upper surface 12a of the semiconductor substrate 12 in portions where the interlayer insulating films 28 are not provided. The upper electrode 70 is insulated from the gate electrodes 26 by the interlayer insulating films 28. On a lower surface 12b of the semiconductor substrate 12, a lower electrode 72 is provided. The lower electrode 72 is in contact with the lower surface 12b of the semiconductor substrate 12.

As shown in FIGS. 1 to 3, inside the semiconductor substrate 12, the aforementioned plurality of source regions 30, the aforementioned body region 32, a drain region 34, a plurality of bottom p-type regions 36, and a plurality of lateral surface p-type regions 38 are provided.

As shown in FIGS. 1 and 2, each source region 30 is provided in a range bordering the upper surface 12a of the semiconductor substrate 12, and is in ohmic contact with the upper electrode 70. Moreover, each source region 30 is in contact with the lateral surface insulating layers 24b at the lateral surfaces of the trenches 22. Each source region 30 is in contact with the lateral surface insulating layers 24b at upper end portions of the trenches 22.

As shown in FIGS. 1 and 3, the body region 32 borders the upper surface 12a of the semiconductor substrate 12 in a range between two of the source regions 30. As shown in FIGS. 2, 3, the body region 32 extends from a position bordering the upper surface 12a to a position below each source region 30. As shown in FIGS. 2 and 3, the body region 32 comprises a plurality of high-concentration regions 32a and a low-concentration region 32b. Each of the high-concentration regions 32a has a higher p-type impurity concentration than the low-concentration region 32b. Each high-concentration region 32a is provided in the range between two of the source regions 30. Each high-concentration region 32a is in ohmic contact with the upper electrode 70. The low-concentration region 32b is provided below each source region 30 and each high-concentration region 32a. The low-concentration region 32b is in contact with the lateral surface insulating layers 24b below each source region 30 and each high-concentration region 32a. A lower end of the body region 32 (i.e., a lower end of the low-concentration region 32b) is provided on an upper side of lower ends of the gate electrodes 26 (i.e., upper surfaces of the bottom insulating layers 24a).

The drain region 34 is an n-type region. As shown in FIGS. 2 and 3, the drain region 34 is provided below the body region 32, and separated from each source region 30 by the body region 32. The drain region 34 comprises a drift region 34a, and a contact region 34b that has a higher n-type impurity concentration than the drift region 34a.

The drift region 34a is provided below the body region 32. As shown in FIG. 2, the drift region 34a is in contact with the lateral surface insulating layers 24b in ranges where the lateral surface p-type regions 38 are not provided. The drift region 34a is in contact with the lateral surface insulating layers 24b below the body region 32. As shown in FIG. 3, the drift region 34a is in contact with the lateral surface p-type regions 38 in ranges where the lateral surface p-type regions 38 are provided.

As shown in FIGS. 2 and 3, the contact region 34b is provided below the drift region 34a. The contact region 34b is provided in a range bordering the lower surface 12b of the semiconductor substrate 12. The contact region 34b is in ohmic contact with the lower electrode 72.

As shown in FIGS. 2 and 3, each of the bottom p-type regions 36 is provided in a range bordering the bottom surface of corresponding one of the trenches 22. Each bottom p-type region 36 is in contact with the bottom insulating layer 24a at the bottom surface of the corresponding trench 22. Each bottom p-type region 36 extends long in the y-direction along the bottom surface of the corresponding trench 22. Each bottom p-type region 36 is in contact with the bottom insulating layer 24a over an entire region of the bottom surface of the corresponding trench 22. Each bottom p-type region 36 is surrounded by the drift region 34a. Each bottom p-type region 36 is separated from the body region 32 by the drift region 34a, except for a portion where the lateral surface p-type region 38, which will be described below, is provided.

Each lateral surface p-type region 38 is a p-type region. As shown in FIG. 3, each lateral surface p-type region 38 extends downward from the body region 32 along the lateral surface of corresponding one of the trenches 22. A lower end of the lateral surface p-type region 38 is connected to the bottom p-type region 36. In other words, the lateral surface p-type region 38 connects the body region 32 and the bottom p-type region 36. The lateral surface p-type region 38 is provided in the cross-sectional portion shown in FIG. 3 (i.e., cross-sectional portion in which the body region 32 is provided in the range bordering the upper surface 12a). The lateral surface p-type region 38 is not provided in the cross-sectional portion shown in FIG. 2 (i.e., cross-sectional portion in which the source region 30 is provided in the range bordering the upper surface 12a). The lateral surface p-type regions 38 are provided at a plurality of portions on the lateral surface of one trench 22.

Next, an operation of the switching element 10 will be described. When the switching element 10 is used, the switching element 10, a load (e.g., a motor), and a power supply are connected in series. A power supply voltage (approximately 800 V in the present embodiment) is applied to a series circuit constituted of the switching element 10 and the load. The power supply voltage is applied in a direction that allows a drain side of the switching element 10 (the lower electrode 72) to have a higher potential than a source side of the switching element 10 (the upper electrode 70). When a gate-on potential (a potential higher than a gate threshold) is applied to the gate electrodes 26, channels (inversion layers) are formed in the body region 32 (i.e., the low-concentration region 32b) in ranges in contact with the lateral surface insulating layers 24b, and the switching element 10 is turned on. When a gate-off potential (a potential equal to or lower than the gate threshold) is applied to the gate electrodes 26, the channels disappear, and the switching element 10 is turned off. The operation of the switching element 10 will hereinafter be described in details.

When the switching element 10 is turned off, a potential of the gate electrodes 26 is lowered from the gate-on potential to the gate-off potential. Consequently, the channels disappear, and a potential of the lower electrode 72 rises. In a course of the rise in the potential of the lower electrode 72, a potential of each of the contact region 34b and the drift region 34a rises. When the potential of the drift region 34a rises, a potential of the bottom p-type regions 36 tries to rise due to capacitive coupling between the drift region 34a and the bottom p-type regions 36. However, in a course of the rise in the potential of the drift region 34a, holes flow from the bottom p-type regions 36 to the body region 32 via the lateral surface p-type regions 38. Therefore, the potential of the bottom p-type regions 36 is maintained at a potential approximately equal to a potential of the body region 32. Therefore, when the potential of the drift region 34a rises, a reverse voltage is applied to a pn junction at an interface between the drift region 34a and a p-type region constituted of the body region 32, the lateral surface p-type regions 38, and the bottom p-type regions 36. Accordingly, a depletion layer spreads from this p-type region to the drift region 34a. The depletion layer spreading from the bottom p-type regions 36 to the drift region 34a suppresses application of a high electric field to the gate insulating layers 24 in the vicinity of the lower ends of the gate electrodes 26.

When the switching element 10 is turned on, the potential of the gate electrodes 26 is raised from the gate-off potential to the gate-on potential. Consequently, channels are formed in the body region 32 in the ranges in contact with the gate insulating layers 24. The channels connect the source regions 30 and the drift region 34a. Consequently, the potential of the drift region 34a decreases, resulting in contraction of the depletion layer that has spread from the body region 32 to the drift region 34a. Accordingly, electrons flow from the upper electrode 70 to the lower electrode 72 via the source regions 30, the channels, the drift region 34a, and the contact region 34b. Moreover, when the potential of the drift region 34a decreases, the potential of the bottom p-type regions 36 tries to decrease due to the capacitive coupling between the drift region 34a and the bottom p-type regions 36. However, in a course of the decrease in the potential of the drift region 34a, holes flow from the body region 32 to the bottom p-type regions 36 via the lateral surface p-type regions 38. Therefore, the potential of the bottom p-type regions 36 is maintained at a potential approximately equal to the potential of the body region 32. Therefore, when the potential of the drift region 34a decreases, a potential difference between the bottom p-type regions 36 and the drift region 34a becomes small, and the depletion layer that has spread from the bottom p-type regions 36 to the drift region 34a contracts. Accordingly, a region in the drift region 34a through which electrons can flow is widened. Therefore, a resistance of the drift region 34a decreases, and electrons easily flow from the upper electrode 70 toward the lower electrode 72. Accordingly, a loss caused in the drift region 34a is suppressed.

As described above, in the switching element 10, since the bottom p-type regions 36 are connected to the body region 32 by the lateral surface p-type regions 38, the depletion layer that has spread from the bottom p-type regions 36 to the drift region 34a contracts in a short time after the switching element 10 is turned on. Therefore, the switching element 10 has a low on-resistance immediately after being turned on.

Next, a method of manufacturing the switching element 10 will be described. The switching element 10 is manufactured from the n-type semiconductor substrate 12 that has an n-type impurity concentration approximately equal to an n-type impurity concentration of the drift region 34a (i.e., the semiconductor substrate 12 before processing). FIGS. 4 to 13 each illustrate a cross section in a process of manufacturing the switching element 10. It should be noted, in each of FIGS. 4 to 13, the cross section on the left side shows a cross section of a range corresponding to FIG. 2, while the cross section on the right side shows a cross section of a range corresponding to FIG. 3. Hereinbelow, the range corresponding to FIG. 2 (a range in which the source region 30 is to be formed in the vicinity of the upper surface 12a) is referred to as a first range 101, while the range corresponding to FIG. 3 (a range in which the body region 32 is to be formed in the vicinity of the upper surface 12a) is referred to as a second range 102.

Figure 4:
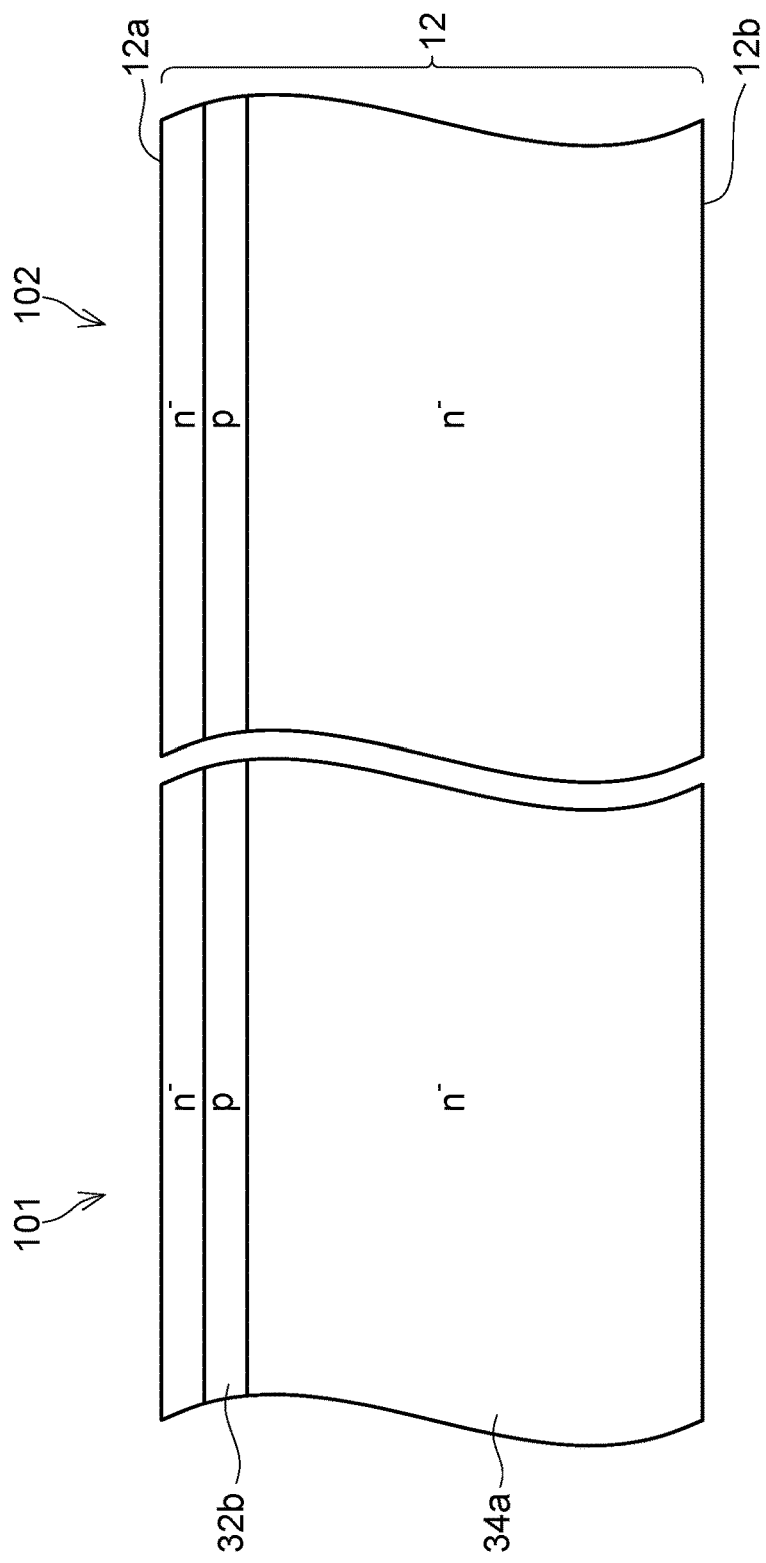
FIG. 4 is a diagram showing a step of manufacturing the switching element 10.

Firstly, as shown in FIG. 4, p-type impurities are implanted at a predetermined depth from the upper surface 12a of the semiconductor substrate 12 before processing, to thereby form a part of the low-concentration region 32b. Here, the low-concentration region 32b is formed astride both of the first range 101 and the second range 102.

Figure 5:
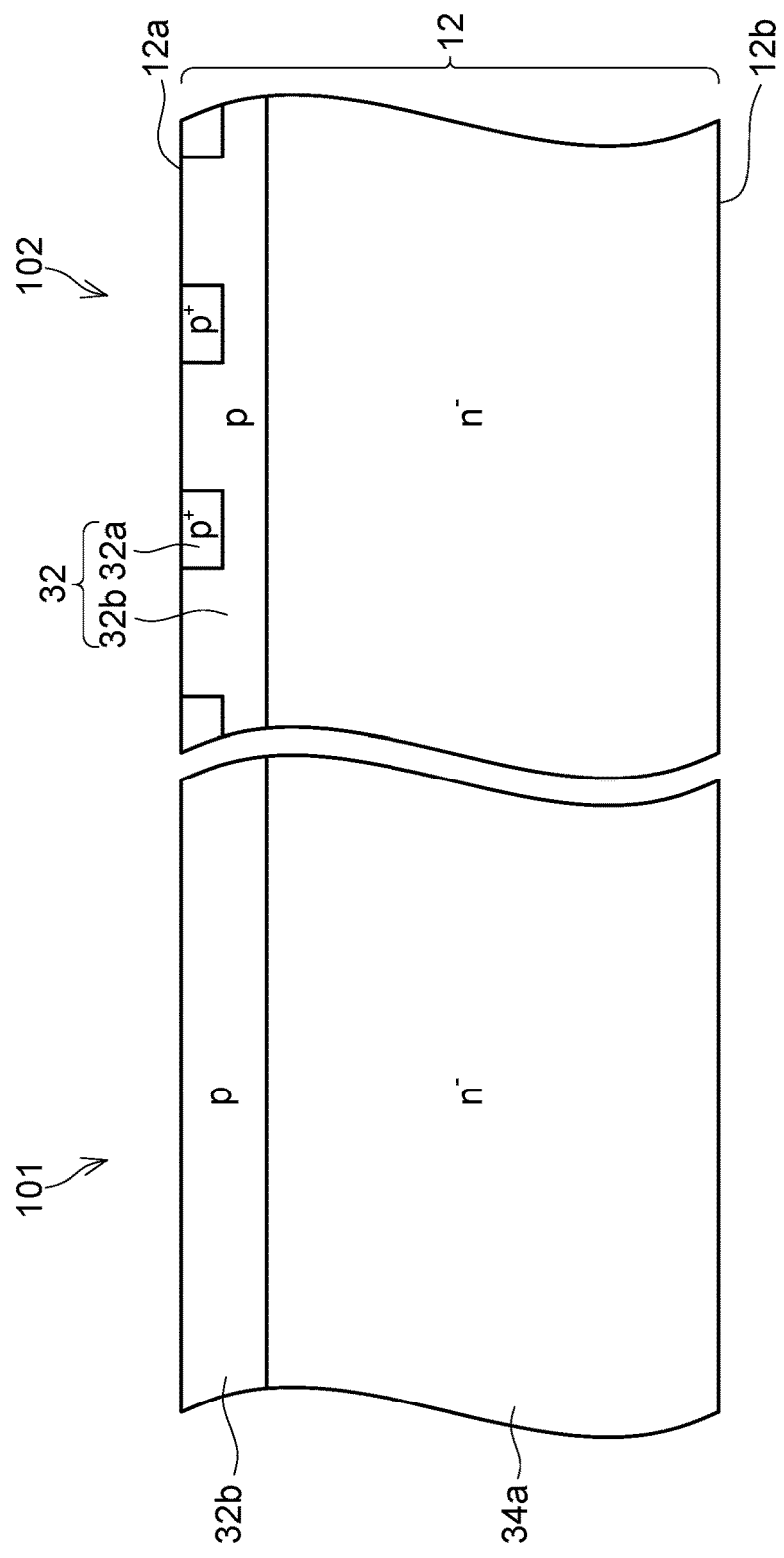
FIG. 5 is a diagram showing a step of manufacturing the switching element 10.

Next, as shown in FIG. 5, p-type impurities are implanted in a depth range exposed to the upper surface 12a of the semiconductor substrate 12, to thereby make the upper surface 12a become p-type. Moreover, p-type impurities are partially implanted into the second range 102 at a high concentration, to thereby form the high-concentration regions 32a of the body region 32.

Figure 6:
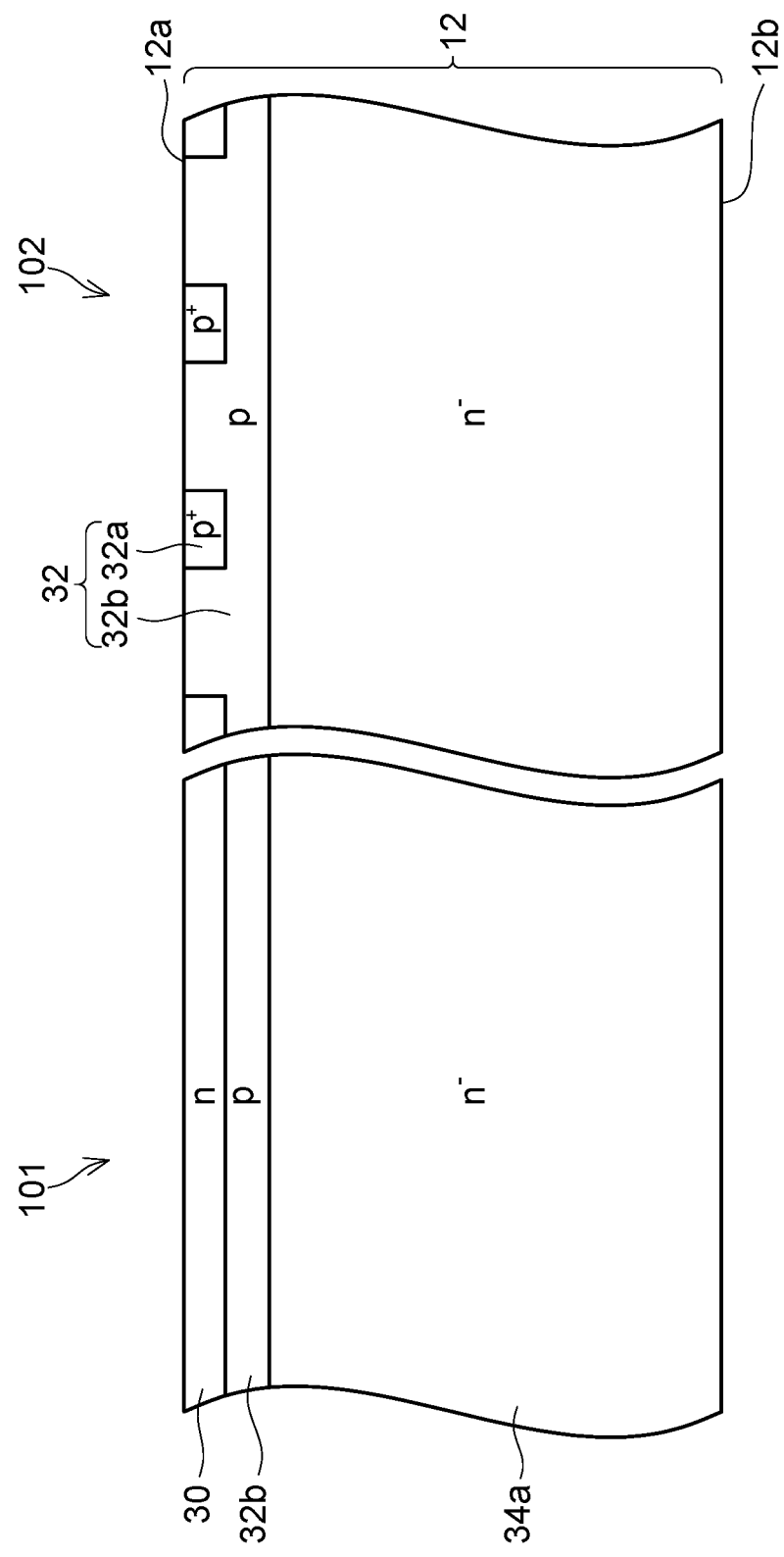
FIG. 6 is a diagram showing a step of manufacturing the switching element 10.

Next, as shown in FIG. 6, n-type impurities are implanted in a depth range exposed to the upper surface 12a in the first range 101, to thereby form the source region 30.

Figure 7:
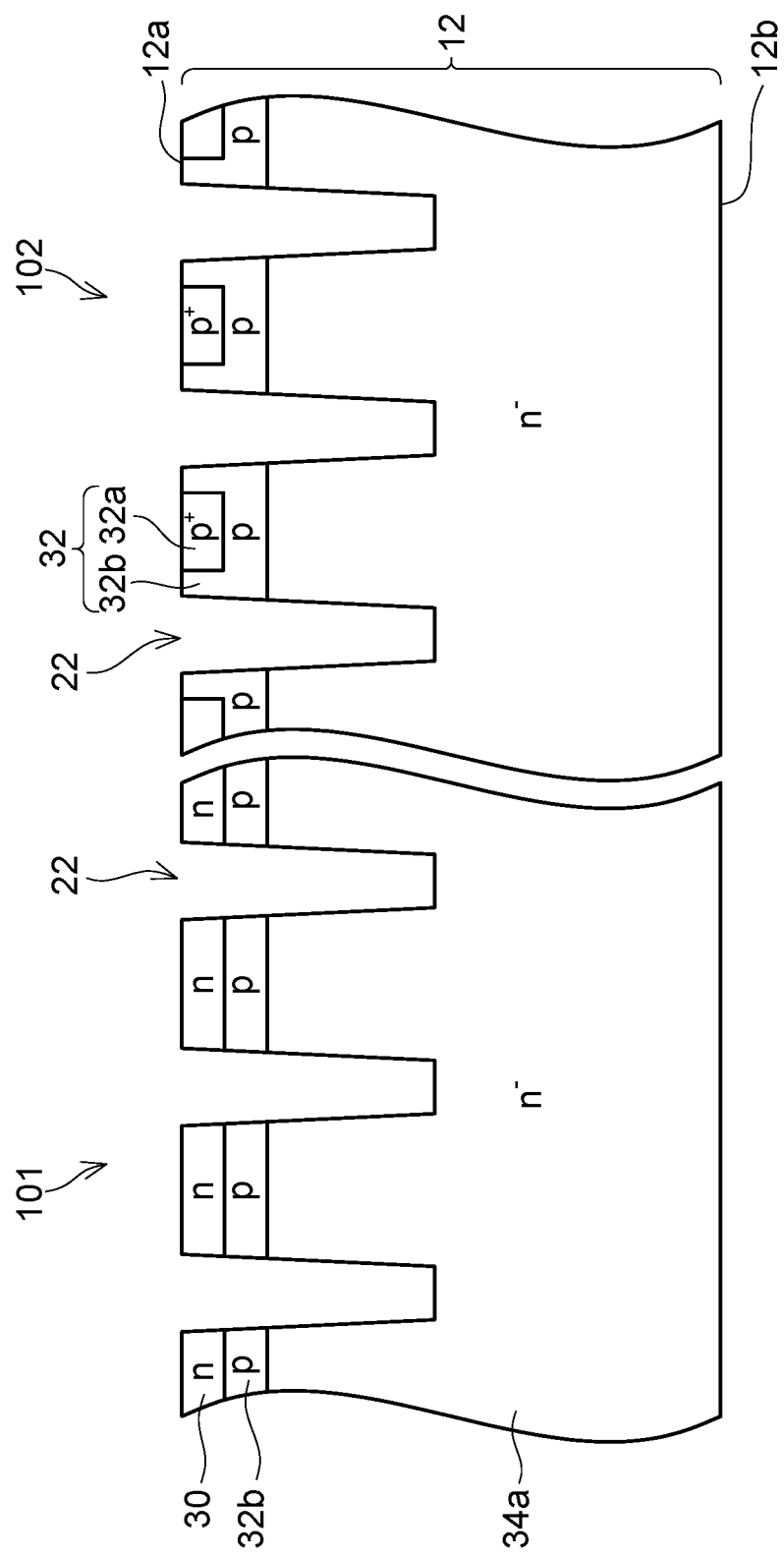
FIG. 7 is a diagram showing a step of manufacturing the switching element 10.

Next, as shown in FIG. 7, the upper surface 12a of the semiconductor substrate 12 is selectively etched, to thereby form the trenches 22. As shown in FIG. 1, the trenches 22 are formed astride the first range 101 and the second range 102. In the first range 101, the source region 30 is located at the upper surface 12a. In the first range 101, the trenches 22 are formed from the upper surface 12a so as to penetrate the source region 30 and the low-concentration region 32b of the body region 32, and to reach the drift region 34a. In the second range 102, the body region 32 is located at the upper surface 12a. In the second range 102, the trenches 22 are formed from the upper surface 12a so as to penetrate the low-concentration region 32b of the body region 32, and to reach the drift region 34a.

Figure 8:
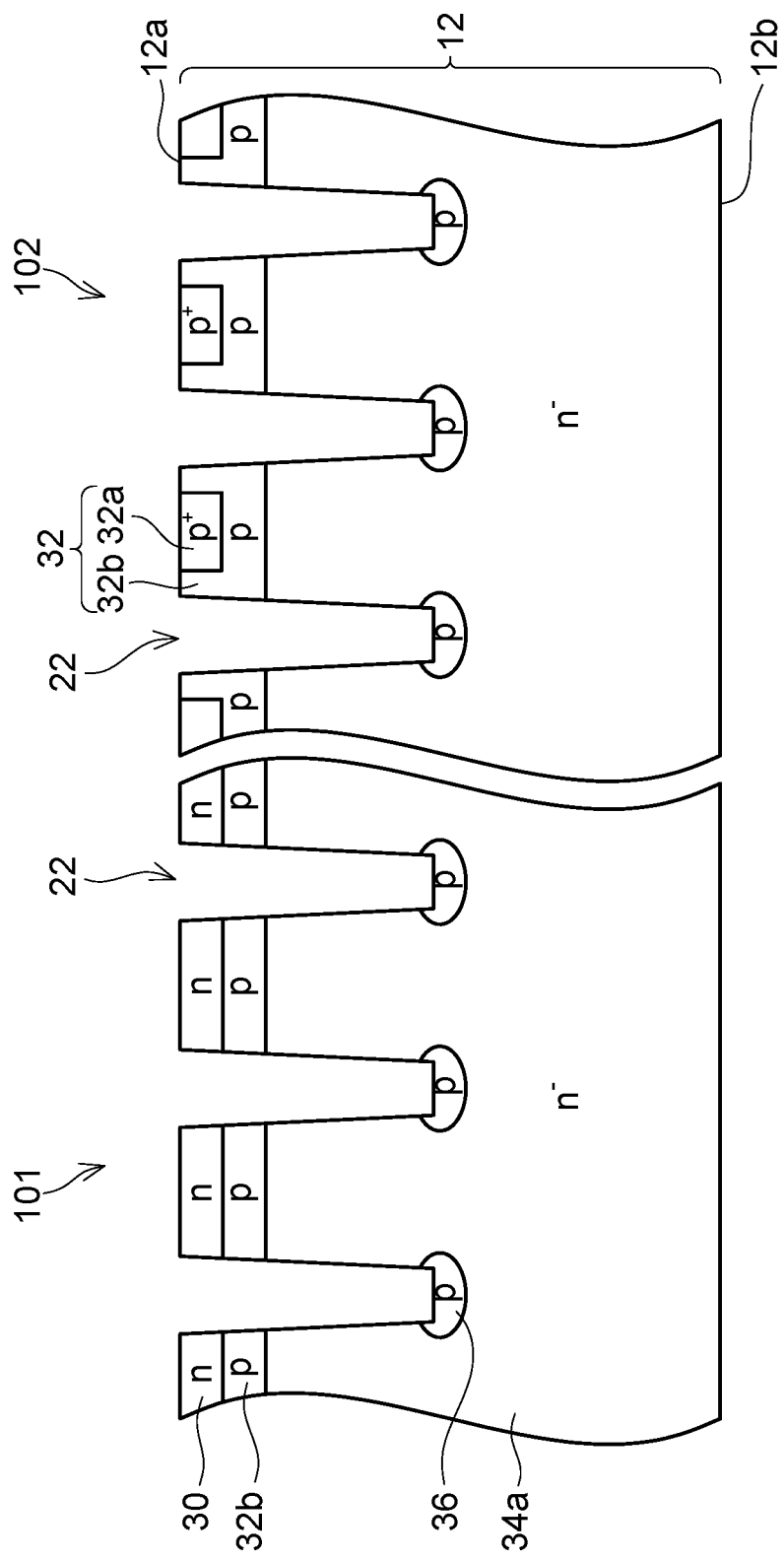
FIG. 8 is a diagram showing a step of manufacturing the switching element 10.

Next, as shown in FIG. 8, p-type impurities are implanted into the bottom surfaces of the trenches 22, to thereby form the bottom p-type regions 36.

Figure 9:
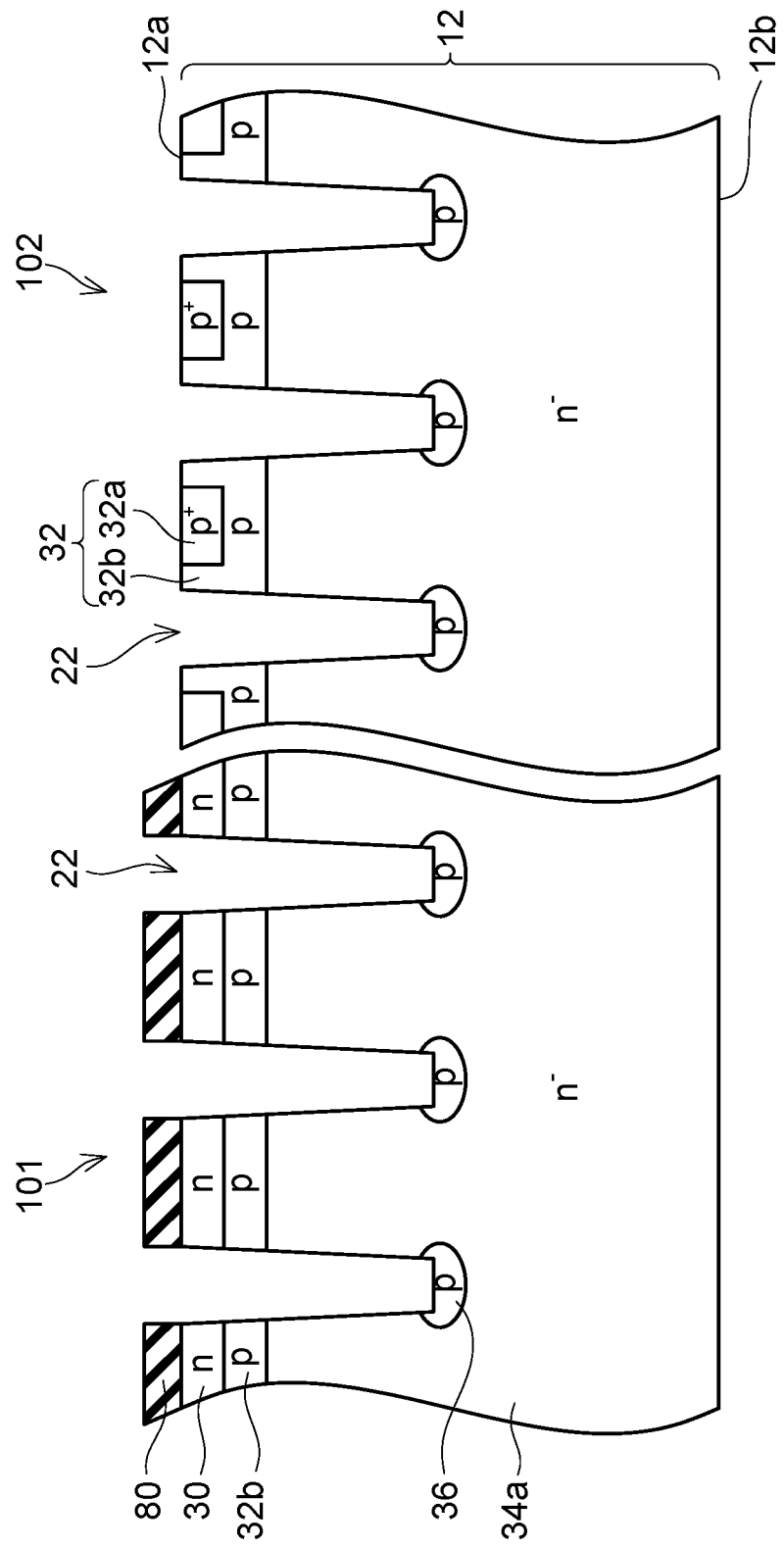
FIG. 9 is a diagram showing a step of manufacturing the switching element 10.
Figure 10:
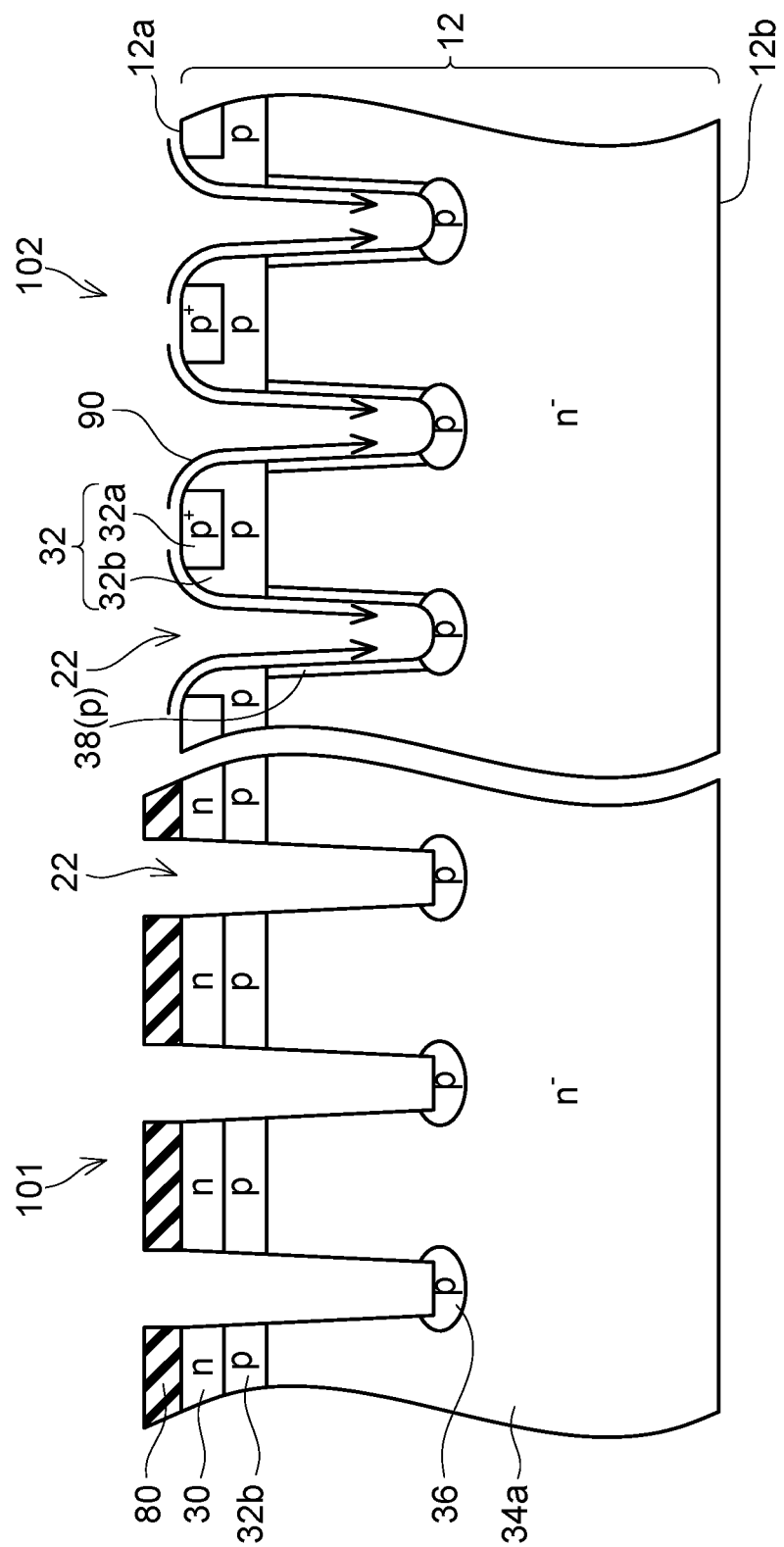
FIG. 10 is a diagram showing a step of manufacturing the switching element 10.

Next, as shown in FIG. 9, a protection 80 is formed on the upper surface 12a in the first range 101. More specifically, the protection film 80 is formed to cover an entirety of the upper surface 12a, and subsequently, the protection film 80 on the upper surface 12a in the second range 102 is removed by etching. Consequently, the upper surface 12a in the first range 101 is covered with the protection film 80, and the upper surface 12a in the second range 102 is exposed from the protection film 80. It should be noted that the protection film 80 is constituted of a high heat-resistant material that has a melting point of 1400° C. or higher. Materials that can be used for the protection film 80 include a material containing carbon (a melting point of which is 3642° C.), boron nitride (a melting point of which is 2700° C.), a high melting-point metal (e.g., molybdenum (a melting point of which is 2610° C.)), and the like.

Next, the semiconductor substrate 12 is thermally treated at a temperature equal to or higher than 1400° C. (more preferably, equal to or higher than 1700° C. ). In the range not covered with the protection film 80 (i.e., the second range 102), a semiconductor material is melted at the upper surface 12a of the semiconductor substrate 12, and the melted semiconductor material flows into the trenches 22 due to migration as shown by an arrow 90 in FIG. 10. Subsequently, when the semiconductor substrate 12 is cooled to a room temperature, the semiconductor material that has flowed into the trenches 22 is solidified. As a result, the lateral surfaces of the trenches 22 in the second range 102 are connected to the bottom surfaces of the trenches 22 and to the upper surface 12a of the semiconductor substrate 12 by smoothly curved surfaces. Moreover, since the upper surface 12a of the semiconductor substrate 12 in the second range 102 is constituted of the p-type body region 32, the semiconductor material that flows into the trenches 22 is a p-type semiconductor. Therefore, the semiconductor material solidified in the trenches 22 forms the lateral surface p-type regions 38 that extend along the lateral surfaces of the trenches 22. Since the semiconductor material that flows into the trenches 22 flows in a downward direction from the body region 32, upper ends of the lateral surface p-type regions 38 are connected to the low-concentration region 32b of the body region 32. Moreover, since the semiconductor material that flows into the trenches 22 reaches the bottom surfaces of the trenches 22, the lower ends of the lateral surface p-type regions 38 are connected to the bottom p-type regions 36. Therefore, the lateral surface p-type regions 38 connect the bottom p-type regions 36 and the body region 32.

As such, the lateral surface p-type regions 38 are formed by the melted semiconductor material being solidified. The semiconductor material loses its crystallinity when melted, and recrystallizes when subsequently solidified. In the lateral surface p-type regions 38 obtained by the recrystallization, crystal defect density is extremely low. Therefore, according to this method, the lateral surface p-type regions 38 that have a low crystal defect density can be obtained. Moreover, in the second range 102, the body region 32 in ranges located at the lateral surfaces of the trenches 22 is also constituted of the semiconductor material that has been melted and then solidified. Accordingly, the body region 32 in the ranges located at the lateral surfaces of the trenches 22 also has an extremely low crystal defect density. Therefore, an entire semiconductor region in the vicinity of the lateral surfaces of the trenches 22 in the second range 102 has an extremely low crystal defect density.

Moreover, since the upper surface 12a in the first range 101 is covered with the protection film 80, migration is suppressed in the first range 101. Therefore, shapes of the source region 30, the body region 32, the trenches 22, and the like below the protection film 80 hardly change before and after the thermal treatment of the semiconductor substrate 12.

Figure 11:
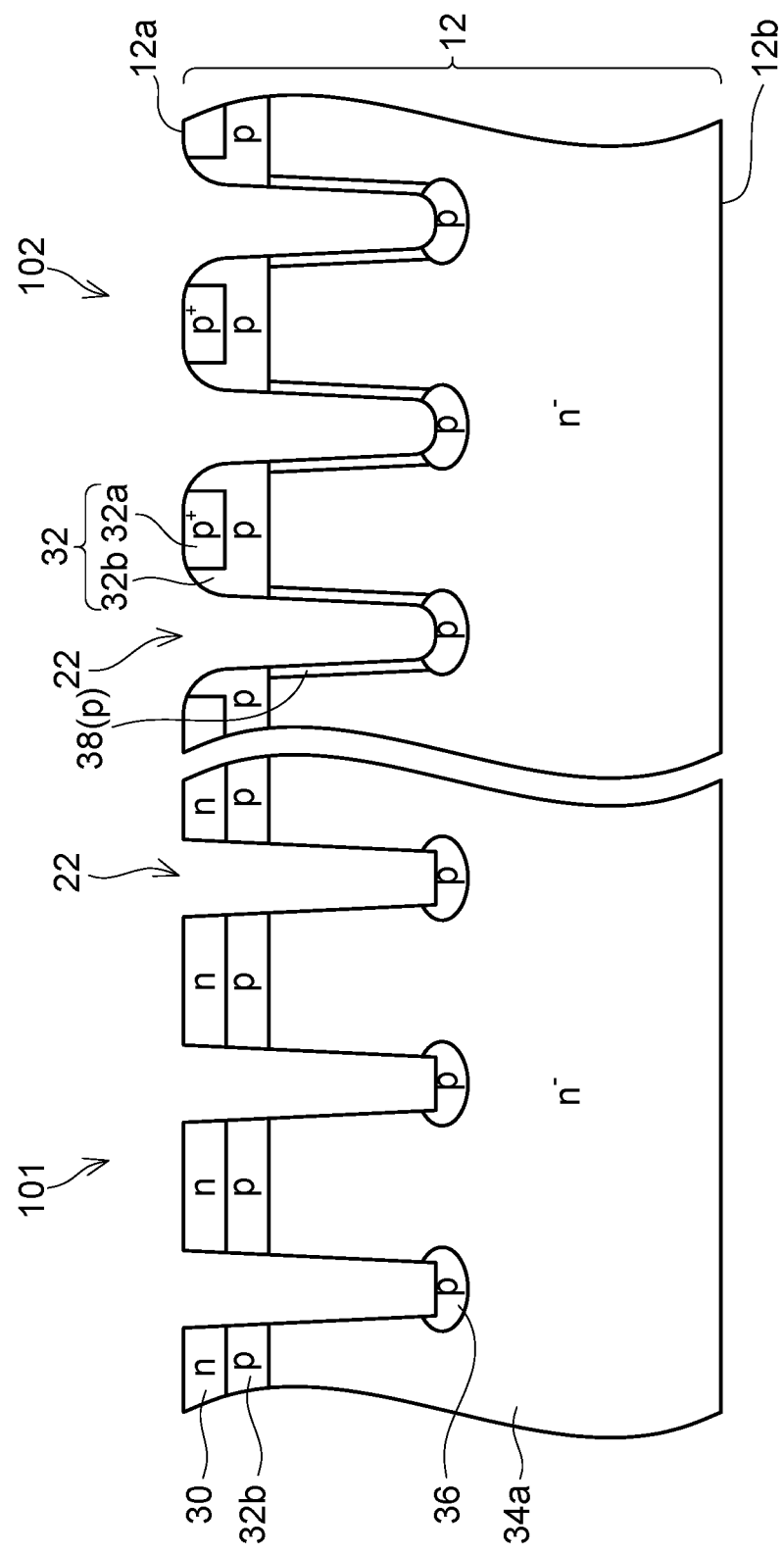
FIG. 11 is a diagram showing a step of manufacturing the switching element 10.

Next, as shown in FIG. 11, the protection film 80 is removed by etching and the like.

Figure 12:
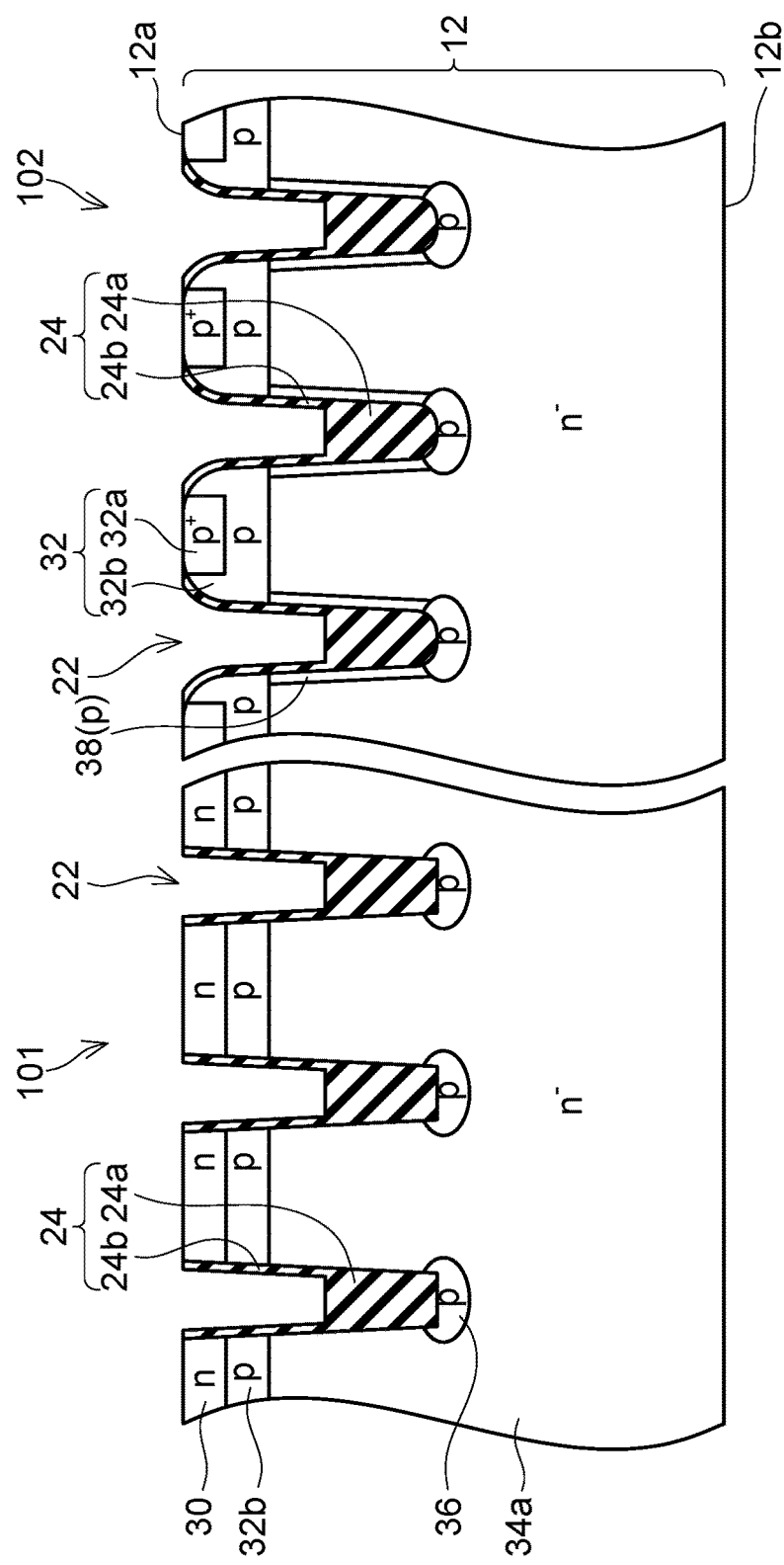
FIG. 12 is a diagram showing a step of manufacturing the switching element 10.

Next, as shown in FIG. 12, a silicon oxide layer is grown on the bottom surface of each of the trenches 22 in the first range 101 and the second range 102, to thereby form the bottom insulating layers 24a. Moreover, a silicon oxide layer is grown on the lateral surface of each of the trenches 22, to thereby form the lateral surface insulating layers 24b. The gate insulating layers 24 are thereby completed.

Figure 13:
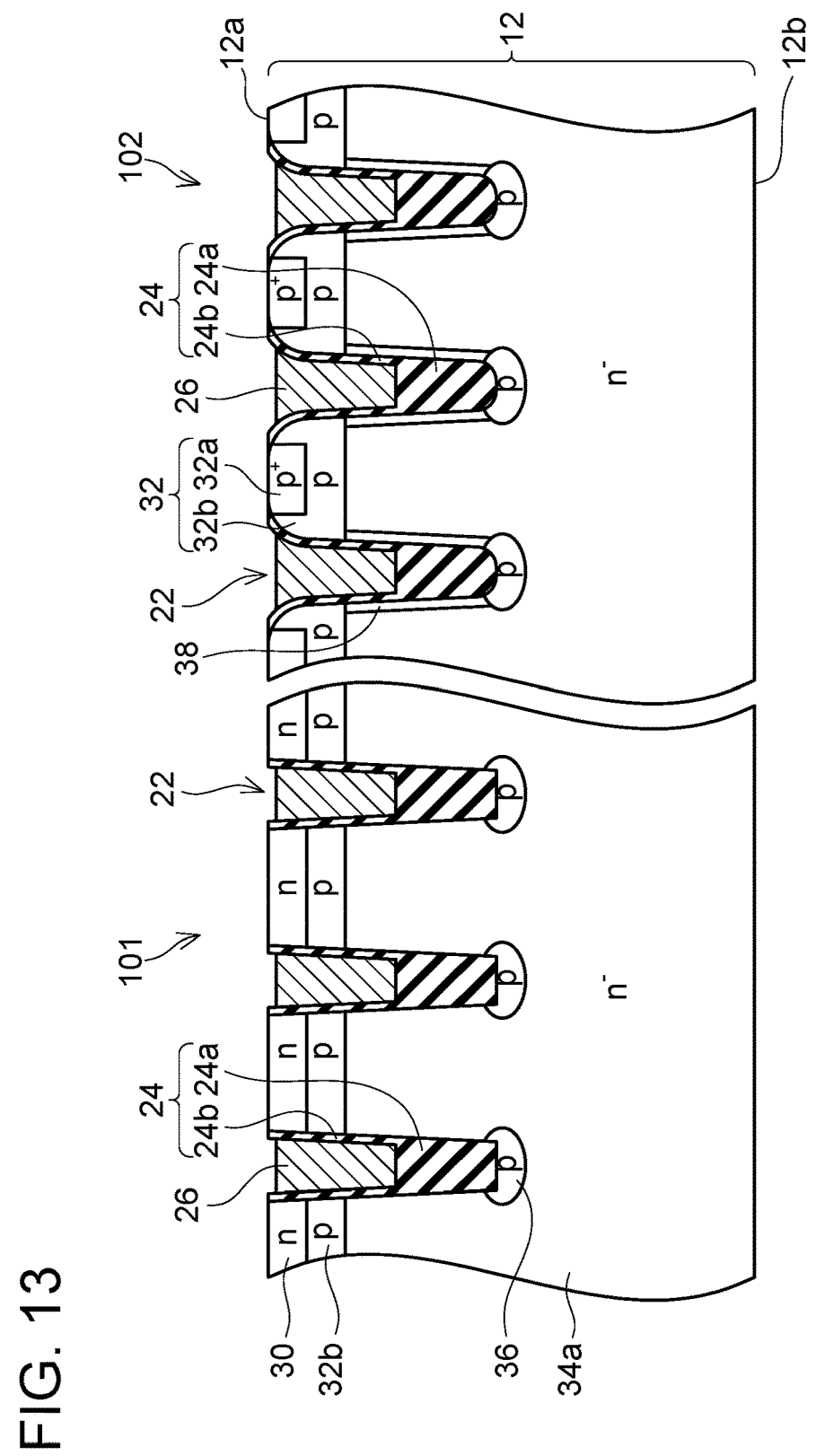
FIG. 13 is a diagram showing a step of manufacturing the switching element 10.

Next, as shown in FIG 13, the gate electrode 26 is formed in each of the trenches 22 in the first range 101 and the second range 102. Subsequently, on the upper surface of each gate electrode 26, the interlayer insulating film 28 is formed. Furthermore, the upper electrode 70 is formed to cover the interlayer insulating films 28, and the upper surface 12a of the semiconductor substrate 12 in ranges exposed from the interlayer insulating films 28. Thereby, a structure of the switching element 10 on an upper side is completed. Next, n-type impurities are implanted into the lower surface 12b of the semiconductor substrate 12, to thereby form the contact region 34b in the range bordering the lower surface 12b. Subsequently, the lower electrode 72 is formed to cover the lower surface 12b, to thereby complete the switching element 10 shown in FIGS. 1 to 3.

In a switching element, if a semiconductor region in a vicinity of a gate insulating layer has a high crystal defect density, a leakage current flows via that semiconductor region in the vicinity of the gate insulating layer when the switching element is off. However, according to the manufacturing method mentioned above, in the range where the lateral surface p-type regions 38 are provided (i.e., the second range 102), a crystal defect density of a semiconductor region constituting of the lateral surfaces of the trenches 22 (i.e., the lateral surface p-type regions 38 and the body region 32 in the vicinity of the lateral surfaces of the trenches 22) can be made low. In other words, a crystal defect density of a semiconductor region in the vicinity of the gate insulating layers 24 can be made low. That is, the lateral surface p-type regions 38 can be formed without increasing the crystal defect density in the vicinity of the lateral surfaces of the trenches 22. Therefore, according to this manufacturing method, the switching element 10 which comprises the lateral surface p-type regions 38 and through which a leakage current is less likely to flow can be manufactured.

Moreover, in a conventional manufacturing method in which p-type impurities are implanted into a lateral surface of a trench to thereby form a lateral surface p-type region, upon forming the lateral surface p-type region on each of both the lateral surfaces of the trench, it is necessary to implant p-type impurities into one of the lateral surfaces, and then into the other of the lateral surfaces. In other words, a step of implanting p-type impurities needs to be performed at least twice. In contrast to this, in the manufacturing method of the embodiment mentioned above, in one step of heating the semiconductor substrate, the lateral surface p-type region 38 can be formed on both of the lateral surfaces of the trench 22. Therefore, according to the manufacturing method of the embodiment, the lateral surface p-type regions 38 can be formed easily.

It should be noted, in the manufacturing method of the embodiment mentioned above, the source regions 30 are formed before the formation of the trenches 22. However, the source regions 30 may be formed at another timing. For example, the source regions 30 may be formed by implanting n-type impurities into the upper surface 12a after the formation of the gate electrodes 26.

Moreover, in the manufacturing method of the embodiment mentioned above, the bottom p-type regions 36 are formed after the formation of the trenches 22 and before the formation of the lateral surface p-type regions 38. However, the bottom p-type regions 36 may be formed at another timing. For example, the bottom p-type regions 36 may be formed by implanting p-type impurities into the bottom surfaces of the trenches 22 after the formation of the lateral surface p-type regions 38. Moreover, the bottom p-type regions 36 may be formed simultaneously with the lateral surface p-type regions 38 by allowing the semiconductor material (the p-type semiconductor) that flows into the trenches 22 to cover the bottom surfaces of the trenches 22, when the lateral surface p-type regions 38 are formed.

Moreover, in the embodiment mentioned above, the semiconductor substrate 12 is a SiC substrate. However, the semiconductor substrate 12 may be constituted of another semiconductor material (e.g., silicon, gallium nitride, or the like). It should be noted, however, that the manufacturing method disclosed herein is particularly effective in a case of using a SiC substrate because a crystal defect formed by ion implantation is particularly difficult to repair in the SiC substrate.

Some of the technical features disclosed herein will be listed hereinbelow. Each of the below technical elements is independently useful.

An example of the manufacturing method disclosed herein may further comprise covering a part of a surface of a semiconductor substrate with a protection film before formation of a lateral surface p-type region. The semiconductor substrate may be heated with the protection film in the formation of the lateral surface p-type region.

By the protection film being provided, fluidization of a semiconductor region below the protection film can be suppressed during the heating. Therefore, by heating the semiconductor substrate with the protection film, the lateral surface p-type region can be formed with a structure of the semiconductor region below the protection film being maintained.

An example of the manufacturing method disclosed herein may further comprise forming a source region so that the source region is located at the surface of the semiconductor substrate in a position adjacent to the trench. A surface of the source region may be covered with the protection film in the covering of the part of the surface of the semiconductor substrate with the protection film.

According to this configuration, the lateral surface p-type region can be formed after the formation of the source region.

An example of the manufacturing method disclosed herein may further comprise forming a bottom p-type region before the formation of the lateral surface p-type region.

According to this configuration, a semiconductor region that has flowed into the trench is in contact with the bottom p-type region at the bottom surface of the trench. Accordingly, the lateral surface p-type region can easily be connected to the bottom p-type region.

While specific examples of the present invention have been described above in detail, these examples are merely illustrative and place no limitation on the scope of the patent claims. The technology described in the patent claims also encompasses various changes and modifications to the specific examples described above. The technical elements explained in the present description or drawings provide technical utility either independently or through various combinations. The present invention is not limited to the combinations described at the time the claims are filed. Further, the purpose of the examples illustrated by the present description or drawings is to satisfy multiple objectives simultaneously, and satisfying any one of those objectives gives technical utility to the present invention.

What is claimed is:

1. A method of manufacturing a switching element, the method comprising:
    preparing a semiconductor substrate which comprises an n-type drain region, a p-type body region, and a trench, the body region being provided on the drain region and located at a surface of the semiconductor substrate, and the trench extending from the surface so as to penetrate the body region and reach the drain region; and
    forming a lateral surface p-type region extending along a lateral surface of the trench below the body region by heating the semiconductor substrate so as to make a part of the body region flow into the trench;
    wherein
    the switching element comprises:
    a gate insulating layer covering an inner surface of the trench;
    a bottom p-type region provided in the semiconductor substrate, in contact with the gate insulating layer at a bottom surface of the trench, and connected to the lateral surface p-type region;
    an n-type source region provided in the semiconductor substrate, in contact with the gate insulating layer at the lateral surface of the trench, and separated from the drain region by the body region; and
    a gate electrode provided in the trench, insulated from the semiconductor substrate by the gate insulating layer, and facing the source region, the body region and the drain region via the gate insulating layer.

2. The method of claim 1, further comprising covering a part of the surface with a protection film before the formation of the lateral surface p-type region,
    wherein the semiconductor substrate is heated with the protection film in the formation of the lateral surface p-type region.

3. The method of claim 2, further comprising forming the source region so that the source region is located at the surface in a position adjacent to the trench,
   wherein a surface of the source region is covered with the protection film in the covering of the part of the surface with the protection film.

4. The method of claim 1, further comprising forming the bottom p-type region before the formation of the lateral surface p-type region.

* * * * *